United States Patent
Pawloski et al.

(10) Patent No.: US 7,014,966 B2
(45) Date of Patent: Mar. 21, 2006

(54) METHOD AND APPARATUS FOR ELIMINATION OF BUBBLES IN IMMERSION MEDIUM IN IMMERSION LITHOGRAPHY SYSTEMS

(75) Inventors: Adam R. Pawloski, San Jose, CA (US); Amr Y. Abdo, Madison, WI (US); Gilles R. Amblard, San Jose, CA (US); Bruno M. LaFontaine, Pleasanton, CA (US); Ivan Lalovic, Mountain View, CA (US); Harry J. Levinson, Saratoga, CA (US); Jeffrey A. Schefske, San Jose, CA (US); Cyrus E. Tabery, Santa Clara, CA (US); Frank Tsai, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 257 days.

(21) Appl. No.: 10/653,844

(22) Filed: Sep. 2, 2003

(65) Prior Publication Data

US 2005/0048223 A1 Mar. 3, 2005

(51) Int. Cl.
  *G03F 7/20* (2006.01)
(52) U.S. Cl. ....................... 430/30; 430/322
(58) Field of Classification Search ................ 430/30, 430/322
  See application file for complete search history.

(56) References Cited

U.S. PATENT DOCUMENTS

| 3,239,998 | A | 3/1966 | Carter et al. ............... 55/159 |
|---|---|---|---|
| 3,904,392 | A | 9/1975 | Vaningen et al. ............... 55/15 |
| 4,346,164 | A | 8/1982 | Tabarelli et al. ............ 430/311 |
| 4,480,910 | A | 11/1984 | Takanashi et al. ............ 355/30 |
| 4,670,637 | A | 6/1987 | Morrison et al. ........... 219/121 |
| 4,889,603 | A | 12/1989 | DiSanto et al. .......... 204/180.1 |
| 5,372,634 | A | 12/1994 | Monahan ..................... 96/175 |
| 5,610,683 | A | 3/1997 | Takahashi ..................... 355/53 |
| 5,825,043 | A | 10/1998 | Suwa ........................ 250/548 |
| 5,834,625 | A | 11/1998 | Kraus, Jr. et al. ............... 73/32 |
| 5,900,354 | A | 5/1999 | Batchelder ................... 430/395 |
| 6,133,995 | A | 10/2000 | Kubota ........................ 356/73 |
| 6,241,827 | B1 | 6/2001 | Tanaka et al. ................ 134/18 |
| 6,576,559 | B1 | 6/2003 | Nakata et al. .............. 438/706 |
| 2002/0163629 | A1 | 11/2002 | Switkes et al. ............... 355/53 |
| 2003/0116014 | A1 * | 6/2003 | Possanza et al. .............. 95/30 |
| 2005/0037269 | A1 * | 2/2005 | Levinson ..................... 430/30 |

FOREIGN PATENT DOCUMENTS

| EP | 1 486 827 A2 | 12/2004 |
|---|---|---|
| EP | 1 489 461 A1 | 12/2004 |
| WO | 99/01797 | 1/1999 |
| WO | 02/091078 A1 | 11/2002 |

* cited by examiner

*Primary Examiner*—Kathleen Duda
(74) *Attorney, Agent, or Firm*—Renner, Otto, Boisselle & Sklar, LLP

(57) ABSTRACT

A method of operating an immersion lithography system, including steps of immersing at least a portion of a wafer to be exposed in an immersion medium, wherein the immersion medium comprises at least one bubble; directing an ultrasonic wave through at least a portion of the immersion medium to disrupt and/or dissipate the at least one bubble; and exposing the wafer with an exposure pattern by passing electromagnetic radiation through the immersion medium subsequent to the directing. Also disclosed is a monitoring and control system for an immersion lithography system.

22 Claims, 1 Drawing Sheet

METHOD AND APPARATUS FOR ELIMINATION OF BUBBLES IN IMMERSION MEDIUM IN IMMERSION LITHOGRAPHY SYSTEMS

TECHNICAL FIELD

The present invention relates generally to the field of integrated circuit manufacture and, more particularly, to a method and apparatus for elimination of bubbles in immersion medium in immersion lithography systems.

BACKGROUND

The formation of various integrated circuit (IC) structures on a wafer often relies on lithographic processes, sometimes referred to as photolithography. For instance, patterns can be formed from a photo resist (PR) layer by passing light energy through a mask (or reticle) having an arrangement to image the desired pattern onto the PR layer. As a result, the pattern is transferred to the PR layer. In areas where the PR is sufficiently exposed and after a development cycle, the PR material can become soluble such that it can be removed to selectively expose an underlying layer (e.g., a semiconductor layer, a metal or metal containing layer, a dielectric layer, etc.). Portions of the PR layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the PR layer is transferred to the underlying layer. Alternatively, the PR layer can be used to block dopant implantation into the protected portions of the underlying layer or to retard reaction of the protected portions of the underlying layer. Thereafter, the remaining portions of the PR layer can be stripped.

There is a pervasive trend in the art of IC fabrication to increase the density with which various structures are arranged. As a result, there is a corresponding need to increase the resolution capability of lithography systems. One promising alternative to conventional optical lithography is a next-generation lithographic technique known as immersion lithography. In immersion lithography, the wafer to imaged by a lithography system is placed in a liquid medium, through which the patterned light is transmitted. The immersion medium replaces an air gap that is conventionally present between the final lens of a conventional dry lithography imaging system and the wafer.

However, attempts to implement immersion lithography have encountered a number of challenges. For example, a bubble (or a plurality of bubbles), disposed in the immersion medium can adversely effect the quality of the exposure pattern incident on the wafer. If the bubble is in the immersion medium but away from the photo resist, it can disperse or scatter incident radiation, thus resulting in a blurring of the radiation and a resultant loss of focus. If the bubble is close to the photo resist, it can block the incident radiation by refracting the radiation. In either case, the presence of the bubble interferes with the lithography process.

Accordingly, there exists a need in the art for improved immersion lithography systems and associated methods of eliminating bubbles from the immersion medium in immersion lithography systems.

SUMMARY OF THE INVENTION

According to one embodiment of the invention, the invention is directed to a method of operating an immersion lithography system. The method can include immersing at least a portion of a wafer to be exposed in an immersion medium, in which the immersion medium contains at least one bubble; directing an ultrasonic wave through at least a portion of the immersion medium to disrupt and/or dissipate the at least one bubble; and exposing the wafer with an exposure pattern by passing electromagnetic radiation through the immersion medium subsequent to the directing. As a result, the at least one bubble is dissipated or dispersed and the immersion medium is rendered into a state that is acceptable for exposing the wafer with an exposure pattern.

In another embodiment, the invention relates to a method of operating an immersion lithography system, including immersing at least a portion of a wafer to be exposed in a liquid immersion medium, in which a traversal volume of the liquid immersion medium contains at least one bubble; directing an ultrasonic wave through at least the traversal volume to disrupt and/or dissipate the at least one bubble; and exposing the wafer with an exposure pattern by passing electromagnetic radiation through the traversal volume subsequent to the directing. As a result, the at least one bubble is dissipated or dispersed and at least the traversal volume of the immersion medium is rendered into a state that is acceptable for exposing the wafer with an exposure pattern.

According to another aspect of the invention, the invention relates to a monitoring and control system for an immersion lithography system. The immersion lithography system can include, for example, the immersion lithography system including a chamber for receiving a wafer to be exposed and immersing the wafer in an immersion medium and an imaging subsystem for directing an exposure pattern towards the wafer and through a traversal volume of the immersion medium. The system further includes an immersion medium treatment subsystem including an ultrasonic generator for directing an ultrasonic wave through at least the traversal volume of the immersion medium through which the exposure pattern is configured to traverse; and a controller, the controller operable to direct the ultrasonic wave through the traversal volume for a time and at an energy to disrupt and/or dissipate at least one bubble in the traversal volume.

As a result of the method and apparatus of the present invention, an immersion lithography system may be operated without interference or unwanted dispersion of the exposure pattern by bubbles present in the traversal volume as the exposure pattern is propagated through a traversal volume and towards the wafer.

BRIEF DESCRIPTION OF DRAWINGS

These and further features of the present invention will be apparent with reference to the following description and drawings, wherein.

Figure 1:
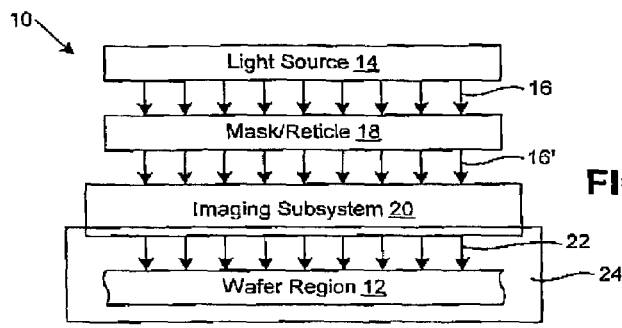
FIG. 1 is a schematic block diagram of a exemplary integrated circuit processing arrangement.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DISCLOSURE OF INVENTION

It should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electro-mechanical systems (MEMS) and so forth.

The apparatus and methods described herein can provide for real-time elimination of interferences in immersion lithography. Namely, the presence in the immersion medium of a bubble (or multiple bubbles), can be eliminated by applying an ultrasonic wave to the immersion medium to improve conditions for exposing a wafer. Bubbles can include, for example, a bubble which is suspended in the immersion medium, and a bubble which is attached to the photo resist. Even very small bubbles can interfere with the immersion lithography process. Therefore, the apparatus described herein can be employed to disrupt and/or dissipate the one or more bubble 28 in the immersion medium 24 (see FIG. 1 and the description below). The term "disrupt and/or dissipate" as used herein includes breaking up of the bubble into smaller bubbles, dissolution of the gas of the bubble into the immersion medium, dispersion of the bubble, dislodging of the bubble from an attachment to a solid surface, and any other process by which the bubble is destroyed, moved or otherwise altered so that it no longer interferes with the immersion lithography process.

As used herein, the terms "immersing a wafer" and "immersing at least a portion of a wafer" include both application of an immersion medium to the entire surface of a wafer and application of an immersion medium to a portion of the surface of the wafer, less than the entire surface. In one embodiment, the immersion lithography tool does not require the immersion of the entire wafer into the immersion medium. In such an embodiment, a liquid immersion medium will be injected between the wafer and the final optical element from which the electromagnetic radiation used to expose the photo resist on the wafer comes. For example, a fluid jet may be used for such purpose. After exposure, a recovery system such as, for example, a suction port, will remove the immersion medium at the exit of the flow area. The wafer stage then will move around underneath the lens element to apply the immersion medium to and then expose each individual die on the wafer to each die on the wafer in turn. Thus, in this embodiment only part of the wafer will be covered by the immersion medium at any given time. In another embodiment, the entire wafer will be submerged into the immersion medium, and the wafer stage will be moved so that each die can be exposed without separate steps of providing and removing the immersion medium for each die on the wafer between exposures.

As used herein, included within the scope of the term "bubble" are both a microbubble and a nanobubble. The present invention is applicable to both microbubbles and nanobubbles, as well as to larger bubbles which may be present in the immersion medium. In one embodiment, a microbubble may have a diameter in the range from about 0.5 micron ($\mu$m) to about 10 $\mu$m. In another embodiment, a nanobubble may have a diameter in the range from about 30 nanometers (nm) to about 500 nm (0.5 $\mu$m). The formation of nanobubbles may be driven by material outgassing or the attachment of a free bubble onto a surface. The attached nanobubble may be more difficult to remove since it is not in the immersion medium.

The maximum size of a bubble in the system may be limited by the geometry and flow rate of the system. That is, a very large bubble may be broken up into a number of smaller bubbles by shear forces in the immersion medium. The thermodynamics of the immersion medium also affect the size of bubbles which can exist, since media containing different materials (e.g., water or perfluoropolymers) impose different effects on bubbles. In general, the larger the bubble, the more detrimental its effects. However, any bubble in the traversal zone is likely to have an adverse effect.

In one embodiment, the one or more bubble 28 has a diameter in the range from about 20 nm to about 100 $\mu$m. In another embodiment, the diameter of the one or more bubble 28 is in the range from about 30 nm to about 10 $\mu$m, and in another embodiment, a diameter from about 30 nm to about 500 nm and in another embodiment from about 0.5 $\mu$m to about 10 $\mu$m. Since it is expected that a bubble will have a substantially spherical shape, the size is referred to as a diameter. If the bubble has a non-spherical shape, the disclosed size range refers to its largest dimension.

In one embodiment, the one or more bubble 28 has a diameter or size sufficient to interfere with the electromagnetic radiation used in the exposing. Interference with the electromagnetic radiation includes any effect, for example, reflection, refraction or absorption of the radiation which results in incorrect or undesired effects on the pattern sought in the exposing. Thus, the size may be great enough, relative to the wavelength of the electromagnetic radiation to block, scatter, blur or otherwise interfere with propagation of the radiation. In one embodiment, the size of the bubble 28 is comparable to or greater than the wavelength of the incident electromagnetic radiation. In one embodiment, as a result of the present invention, there is reduced interference with the electromagnetic radiation used in the immersion lithography following application of the ultrasonic wave 36 to disrupt and/or dissipate the one or more bubble 28.

Referring to FIG. 1, illustrated is a schematic block diagram of an exemplary IC processing arrangement that includes an immersion lithography system 10 used to image a pattern onto a wafer 12, or a region thereof. The system 10 can be, for example, a step-and-repeat exposure system or a step-and-scan exposure system, but is not limited to these example systems. The system 10 can include a light source 14 for directing light energy 16 towards a mask 18 (sometimes referred to as a reticle). The light energy 16 can have, for example, a deep ultraviolet (DUV) wavelength (e.g., about 248 nm or about 193 nm) or a vacuum ultraviolet (VUV) wavelength (e.g., about 157 nm).

The mask 18 selectively blocks light energy 16 such that a light energy pattern 16' defined by the mask 18 is transferred towards the wafer 12. An imaging subsystem 20, such as a stepper assembly or a scanner assembly, sequentially directs the energy pattern 16' transmitted by the mask 18 to a series of desired locations on a photo resist on the wafer 12. The imaging subsystem 20 may include a series of lenses and/or reflectors for use in scaling and directing the energy pattern 16' towards the wafer 12 in the form of an imaging (or exposure) light energy pattern 22.

The imaging pattern 22 (or exposure pattern) is transmitted by the imaging subsystem 20 through an immersion fluid, or immersion medium 24, that has a relatively high index of refraction (e.g., an index of refraction greater than 1). The immersion medium 24 can be a liquid. In one example, purified de-ionized water can be used in conjunction with a 193 nm light source 14 (e.g., an argon fluorine (ArF) laser). In another example, polyfluoroethers can be used in conjunction with a 157 nm light source 14. The immersion medium should be a material which is transparent to the wavelength of the light or electromagnetic radiation source used in the immersion lithography process. The immersion medium, in one embodiment, has a refractive index higher than that of air, and in one embodiment, has a refractive index which is comparable to that of the optics employed.

Figure 2:
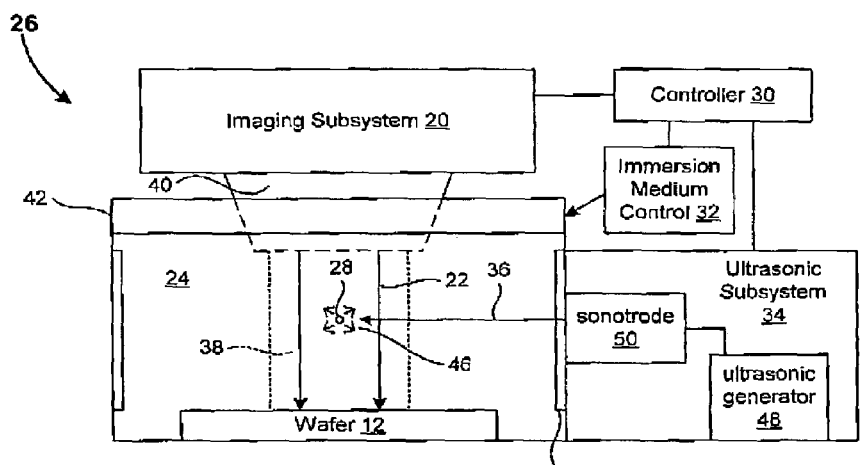
FIG. 2 is a schematic block diagram of an apparatus for elimination of bubbles in immersion medium for an exemplary integrated circuit processing arrangement.

Referring next to FIG. 2, there is shown a schematic block diagram of relevant components of an immersion lithography system assembly 26 for use with the exemplary IC processing arrangement 10. An exemplary bubble 28 is shown in the immersion medium 24 in FIG. 2. As will be understood, while a single bubble 28 is shown, and a single bubble is sufficient to create problems in the immersion lithography, a plurality of such bubbles 28 may be present. The assembly 26 includes the imaging subsystem 20, a controller 30, an immersion medium control 32, and an ultrasonic assembly 34. As will be understood by those having ordinary skill in the art, the presence of the bubble 28 in the immersion medium 24 can have a detrimental effect on the imaging pattern 22 output by the imaging subsystem 20 and incident on the wafer 12. For instance, the bubble 28 may absorb or scatter a portion of the imaging pattern 22. Thus, the presence of one or more such bubbles 28 can lead to defects in the integrated circuit being fabricated on the wafer 12.

In one embodiment, the immersion medium 24 fills the space between the photo resist and the lens or optics in the imaging subsystem. In one embodiment, the space or gap between the photo resist and the optics, filled by the immersion medium, is from about 0.25 mm to about 5 mm, and in one embodiment from about 0.5 mm to about 2 mm across. Thus, in one embodiment, the traversal volume has a thickness or traversal length in these ranges.

While not to be bound by theory, the possible sources of the bubbles 28 may vary widely. For example, turbulence in the immersion medium 24 may cause bubbles to form and/or become submersed in the immersion medium 24. One source of turbulence can be the movement of a stage (not shown) upon which the wafer 12 may be mounted and moved relative to the imaging subsystem 20. For example, the wafer 12 may be exposed, then moved about 30 mm to a new location and stopped for a second exposure and so forth. Wafer motion rates can be about 250 mm/second to about 500 mm/second. This movement may create turbulence or other changes to the properties of the immersion medium 24 that could result in the formation of bubbles. In addition, it is contemplated that the immersion medium 24 may be purposefully placed in motion (e.g., in a flow pattern over the wafer 12) or subjected to hydraulic pressure. During exposure, gases may be generated in the photoresist. These gases could dissolve in the immersion medium, ultimately leading to bubble formation. It is also contemplated that a bubble 28 may be carried on the wafer and brought into the immersion medium 24 where the bubble 28 may either remain attached or dislodge from the wafer 12 and "float" in the immersion medium 24. In addition, as will be understood, the immersion medium may contain dissolved gases, such as air or other gases resulting from chemical reactions, which may merge together to form bubbles.

Figure 3:
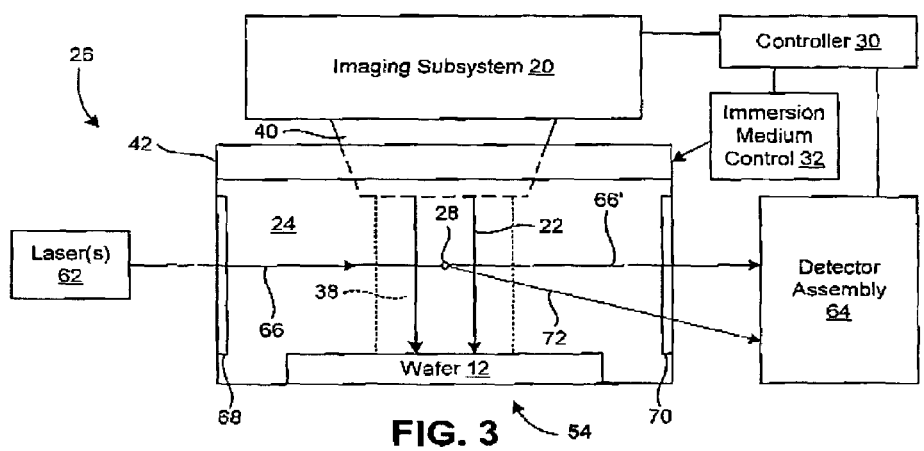
FIG. 3 is a schematic block diagram of an apparatus for detection and elimination of bubbles in immersion medium for an exemplary integrated circuit processing arrangement.

In one embodiment, it is desirable to monitor the immersion medium 24 for the presence of bubbles 28. Thus, the system 26 may include a bubble detection means such as shown in FIG. 3 and described in more detail below. Such detection means are shown and described copending, commonly assigned U.S. patent application Ser. No. 10/638,927, filed Aug. 11, 2003, published as U.S. 2005/0037269 on Feb. 17, 2005, entitled METHOD AND APPARATUS FOR MONITORING AND CONTROLLING IMAGING IN IMMERSION LITHOGRAPHY SYSTEMS, the disclosure of which is hereby incorporated by reference for its teachings relating to detection, monitoring and controlling the presence of bubbles in immersion lithography systems. Where such monitoring means is included in the system 26, it may be disposed, for example, at right angles to the direction of propagation of the ultrasonic wave, or at other suitable locations with respect to the immersion medium.

Accordingly, the assembly 26 can include a controller 30, such as a computer programmed to control the IC processing arrangement 10 (including the light source 14, the mask/reticle 18 and the imaging subsystem 20), an immersion medium control subsystem 32, and an ultrasonic subsystem 34. As depicted in FIG. 2, the ultrasonic subsystem 34 is arranged to output an ultrasonic wave 36 to interact with and disrupt and/or dissipate the bubble 28 which is located in a volume 38 of the immersion medium 24 which is traversed by the output from the imaging subsystem 20. The volume 38 is referred to herein as the traversal volume 38. The traversal volume 38 is a part of the immersion medium 24. While the bubble 28 may occur in any portion of the immersion medium 24, the traversal volume 38 is the part of most concern with respect to the possible presence of the bubble 28.

As indicated, the imaging subsystem 20 can include an output lens 40, or other final optical structure. In the embodiment illustrated in FIG. 2, at least a portion of the imaging subsystem 20, including the lens 40, extends into a chamber 42 containing the immersion medium 24 and the wafer 12. The lens 40 will be in intimate contact with the immersion medium 24 such that the imaging pattern 22 output by the lens 40 is projected through the immersion medium 24 and is incident onto at least a portion of the wafer 12, which is disposed or immersed in the immersion medium 24.

As noted, the traversal volume 38 of the immersion medium 24 in the exposure field of the imaging pattern 22 is the volume or portion of the immersion medium 24 through which the imaging pattern 22 traverses. In one embodiment, the lens 40 can be disposed about 1 mm above the wafer 12. Embodiments with other traversal lengths are disclosed above. However, the distance between the lens 40 and wafer 12 may vary depending on the illumination wavelength, the immersion medium 24, the specific processing arrangement 10, the devices being fabricated on the wafer 12, the particular photo resist employed, and so forth. In one embodiment, the traversal volume 38 can cover an area, for example about 25 mm×about 10 mm (with the above-disclosed traversal length constituting the third dimension of the traversal volume 38), although in various embodiments these parameters can vary widely.

In one embodiment, the immersion medium 24 is a material which is not affected by the radiation which traverses the medium, and which has a refractive index substantially similar to that of the lens 40. The immersion medium 24 acts in an analogous manner to the immersion liquid used in an optical microscope, as will be understood by those of ordinary skill in the art.

The ultrasonic subsystem 34 includes elements normally found in an ultrasonic device, such as a power supply, a transducer or ultrasonic generator 48 to convert input electrical energy to vibrations at the selected operating frequency, and a sonotrode 50 which resonates at the operating frequency and is the point from which the ultrasonic wave is output from the ultrasonic subsystem 34. The power supply converts electrical power to the frequency, voltage and current selected by the controller 30 for the ultrasonic subsystem 34. The power supply (not shown) may include an automatic regulation system which supplies the correct amount of power to maintain the ultrasonic vibrations at the specified amplitude. The amplitude of the vibrations in the wave 36 may range, for example, in one embodiment from about 0.1 to about 50 microns, and in another embodiment, from about 1 to about 20 microns. In one embodiment, the ultrasonic wave 36 has a frequency in the range from about 20 kHz to about 50 MHz, and in one embodiment, from about 20 kHz to about 500 kHz, and in another embodiment, from about 20 kHz to about 100 kHz. In one embodiment, the wave 36 is a longitudinal wave. In a longitudinal wave, the wave is propagated through a medium and the particles of the medium are disturbed or move in the same direction as the ultrasonic wave, e.g., when the ultrasonic wave moves left to right, the particles move left to right. The ultrasonic wave is composed of compressions, where the particles are closer together than normal, and rarefactions, where the particles are farther apart than normal.

In one embodiment, the energy or power imparted by the ultrasonic subsystem is in the range from about 0.1 to about 100 watts. In another embodiment, the energy or power is in the range from about 1 to about 50 watts.

Here and elsewhere in the specification and claims, the numerical limits of the disclosed ranges and ratios may be combined. Thus, for example, in the foregoing energies, although a range from about 0.1 to about 50 watts is not specifically disclosed, this range is considered to be included in the foregoing disclosure.

In one embodiment, the ultrasonic wave 36 generated by the ultrasonic assembly 34 comprises several discrete waves, providing multiple waves 36 to simultaneously disrupt and/or dissipate bubbles 28 in the immersion medium 24 throughout the entire volume of the traversal volume 40. If needed, additional ultrasonic assemblies 34 can be added, although one is generally expected to be sufficient. For simplicity, the single ultrasonic wave 36 is shown and described. However, implementing a multiple wave system should be apparent to one of ordinary skill in the art. For example, a second ultrasonic subsystem may be disposed to generate an ultrasonic wave propagating at right angles to the ultrasonic wave 36. In such an embodiment, the frequency, time and power of the second ultrasonic wave may be independently selected and applied.

The ultrasonic subsystem 34 should be controlled to generate an output frequency, time and power level appropriate to avoid damage to or activation of the photo resist disposed on the wafer 12, and to avoid damaging structures already formed on the wafer 12.

The chamber 42 includes an entrance window 44 through which the ultrasonic wave 36 generated by the ultrasonic subsystem 34 enters the chamber 44. The window 44 should be transmissive of the frequency of the wave 36, and may include a mechanical attachment to the sonotrode for facilitating transmission of the wave 36. In one embodiment, the window 44 comprises the faceplate or vibratory surface of the sonotrode. In one embodiment, the vibratory surface of the sonotrode is adjacent to, and in one embodiment, is integral with, the window 44.

In one embodiment, the bubbles comprise air. In other embodiments, the bubbles comprise other gases, such as gases generated by chemical reactions associated with the mask or reticle or entrained in or on the mask or reticle.

When the ultrasonic wave 36 encounters the bubble 28, the wave 36 will transmit its energy at its frequency to the bubble 28, thus causing it to break apart, that is, to be disrupted and/or dissipated. In one embodiment, the ultrasonic wave 36 disrupts the localized structure of the immersion medium 24 to disrupt and/or dissipate the at least one bubble 28. Disruption and/or dissipation of the bubble 28 is schematically depicted by the arrows 46 in FIG. 2. In one embodiment, the energy imparted by the wave 36 may cause the bubble to burst into a plurality of smaller bubbles which may then dissolve in the medium 24, or it may cause the gas or gases of which the bubble is composed to directly dissolve into the medium 24. In another embodiment, imparting the energy carried by the wave 36 to the bubble 28 may simply result in movement of the bubble 28 out of the traversal volume 38.

In one embodiment, the ultrasonic wave 36 is applied for a very brief period. As will be recognized, ultrasonic energy can impart a great deal of energy to a medium such as the immersion medium, and imparting too great an amount of energy may be detrimental. Therefore, it may be desirable to apply the ultrasonic energy for limited, brief periods only as needed to remove bubbles. In one embodiment, the ultrasonic wave 36 may be applied for a period ranging from about 1 microsecond to about 500 milliseconds, and in one embodiment for a period ranging from about 100 microseconds to about 10 milliseconds. As will be understood, the temporal duration of the ultrasonic energy application will depend to some degree on the frequency of the ultrasonic wave 36, a higher frequency requiring a shorter duration to input a given number of vibrations or pulses to the immersion medium and to the one or more bubble 28. For example, at a frequency of 100 kHz, in one millisecond, 100 cycles or pulses will be applied to the immersion medium 24. This may be a sufficient number to disrupt and/or dissipate a bubble 28 in the immersion medium 24. The amount of energy required to disrupt and/or dissipate any given bubble will also depend on the size of the bubble and on the nature of the liquid in which the bubble is located. For example, more energy may be required to disrupt and/or dissipate a bubble in a very viscous liquid or in a non-polar liquid, while less energy may be required for a less viscous, more polar liquid such as water. As will be understood, solubility of the gas of which the bubble 28 is comprised in the immersion medium 24 depends, inter alia, on the nature and temperature of both the gas and the medium. Some amount of experimentation will easily reveal the duration of pulses and the frequency of the ultrasonic wave 36 needed for a given situation or process.

Any or all of the foregoing factors may be varied and adjusted to optimize the disruption and/or dissipation of the one or more bubble in the traversal volume or the immersion medium as a whole.

In an embodiment in which no detector is included as part of the immersion lithography system assembly 26, the ultrasonic wave 36 may be applied to the immersion medium for a predetermined time and frequency, to disrupt and/or dissipate any bubble 28 which may be present in the traversal volume 38 or the immersion medium 24. In one embodiment, the ultrasonic subsystem 34 may be operated to output a range of frequencies, amplitudes and powers. Such frequencies, amplitudes and powers may be preselected based on predetermined criteria or on experience, to cover the range of bubbles 28 which may be present.

In one embodiment, schematically depicted in FIG. 3, it is desirable to monitor the immersion medium 24 for the presence of bubbles 28 and control the immersion medium 24 should the presence of a bubble 28 be detected. Accordingly, the assembly 26 can include a controller 30, such as a computer programmed to control the IC processing arrangement 10 and an immersion medium control subsystem 32. The controller 30 can receive an in put signal or signals from an immersion medium monitoring subsystem 54.

As indicated, the imaging subsystem 20 can include an output lens 40, or other final optical structure. At least a portion of the imaging subsystem 20, including the lens 40, can enter a chamber 42 containing the immersion medium 24 and the wafer 12. The lens 40 will be in intimate contact with the immersion medium 24 such that the imaging pattern 22 output by the lens 40 is projected through the immersion medium 24 and is incident onto at least a portion of the wafer 12, which is disposed or immersed in the immersion medium 24.

The monitoring subsystem 54 includes devices to monitor the immersion medium 24 or a portion thereof, such as the traversal volume 38 portion of the immersion medium 24, for the presence of a bubble 28. The monitoring subsystem 54 can include, for example, a laser beam source 62 and a detector assembly 64. The detector assembly 64 can be implemented with, for example, a photomultiplier tube. In one embodiment, a beam 68 generated by the laser 62 is several hundred microns in diameter. Therefore, multiple beams 66 produced by one or more lasers 62 can be used to simultaneously monitor the immersion medium 24 throughout the entire volume of the traversal volume 38. If needed, additional detector assemblies 64 can be added. For simplicity, the monitoring associated with only one beam 66 is shown and described. However, implementing a multiple beam system should be apparent to one of ordinary skill in the art. In an alternative embodiment, one or more beams 66 can be scanned through the traversal volume 38 to monitor the immersion medium 24 throughout the traversal volume 38.

The laser 82 should be selected to generate an output wavelength to avoid activation of the photo resist disposed on the wafer 12. For example, the wavelength should be about 300 nm or above (e.g., in the visible spectrum), but this parameter can vary depending on the properties of the photo resist used. In one embodiment, a helium neon (HeNe) laser can be used.

The chamber 42 can include an entrance window 68 through which the beam 66 generated by the laser 62 enters the chamber 42 and an exit window 70 through which the beam exits the chamber 42. The windows 66, 70 should be transmissive of the wavelength of the beam 66 generated by the laser 62 and can include an anti-reflective coating or other mechanism for facilitating beam 66 transmission.

If the beam 66 does not encounter a bubble 28, the beam 66 will substantially pass directly through the immersion medium 24. As a result, the beam 66 will be incident on the detector assembly 64 in a predicable location and/or with a predictable intensity. A signal indicative of the location and/or intensity of the beam 66 can be generated and output by the detector assembly 64. The signal output by the detector assembly 64 can be received by the controller 30. In one embodiment, the controller 30 is programmed to analyze the signal received from the detector assembly 64. If the controller 30 determines that the beam 66 did not encounter a bubble 28, then it can be concluded that favorable conditions exist to expose the wafer 12. Accordingly, the controller 30 can be programmed to send control commands to the processing arrangement 10 to expose the wafer 12.

In the situation where the beam 66 does encounter a bubble 28, a majority of the beam 66 may pass directly through the immersion medium 24 and become incident on the detector assembly 64. However, in some cases, the beam incident on the detector assembly 64 will be a diminished beam 66' (e.g., having a location that is different than expected and/or an intensity that is less than expected).

Also, in the presence of a bubble 28, a portion of the beam 66 can become scattered to form a scattered light segment 72. The detector assembly 64 can be configured to detect the scattered light segment 72 and/or the diminished beam 66'. Upon detection of the scattered light segment 72 and/or the diminished beam 66', the detector assembly 64 can be configured to generate a signal containing information indicating that a bubble 28 disrupted the beam 66. The information can include data concerning the location and intensity of the detected scattered light segment 72 and/or the location and intensity of the diminished beam 66'.

The signal can be received by the controller 30, which, in turn, is programmed to process the signal. In one example, the controller 30 can determine if the scattered light segment 72 contains an amount of light below a threshold amount (e.g., indicating the absence of a bubble 28) or above the threshold amount (e.g., indicating the presence of a bubble 28). In another example, the presence or absence of a bubble 28 can be determined by comparing information relating to the beam 66 or the diminished beam 66' as incident on the detector assembly 64 (e.g., location and/or intensity values) against expect results. In yet another example, a combination of information from the scattered light segment 72 and/or the beam 66 (or diminished beam 66') can be used to monitor for the presence or absence of a bubble 28.

Should the processing by the controller 30 be consistent with the identification of bubble 28 within at least the traversal volume 38, the controller 30 can be programmed to defer exposure of the wafer 12 since conditions within the immersion medium 24 are likely to be unfavorable to achieving a satisfactory exposure of the wafer 12.

As indicated, multiple beams can be used to monitor for the presence of a bubble 28 (or bodies) at multiple locations of the traversal volume 38, if not all of the traversal volume 38. Alternatively, one or more beams can be scanned across the traversal volume 38 to monitor for the presence of a bubble 28 (or bodies) at multiple locations of the traversal volume 38, if not all of the traversal volume 42. In these embodiments, the detector assembly 64 (or assemblies) can be configured to generate a composite signal or multiple signals to the controller 30.

In one embodiment, measurement(s) of light by the detector assembly, or raw data from the monitoring subsystem 54 from which bubble 28 detection can be ascertained, can be transmitted from the detector assembly 64 to the controller 30 in the form of an input signal or signals. The controller 30 can process the input signal(s) to determine if a bubble 28 is present at any location in the traversal volume 38.

In an embodiment in which a detector is included as part of the immersion lithography system assembly 26 information obtained from the detector may be used by the controller 30 to control the ultrasonic subsystem 34 to output a range of frequencies, amplitudes and/or powers appropriate to the size and/or identity of the bubbles 28 detected by the system. As described above, the presence or absence of a bubble 28 can be determined by comparing information obtained from the laser beams transmitted through the immersion medium 24. Such information may be based on diminishment of the laser beam or by the presence of scattered light produced when the laser beam is incident upon the bubble 28. as described above.

If no bubble 28 is detected, or if one or more bubbles 28 are detected and are disrupted and/or dissipated by the ultrasonic beam 46, the controller 30 can issue commands to the system 10 to expose the photo resist on the wafer 12, thereby completing the step of exposing. Thereafter, the immersion lithography process can be continued by carrying out other steps known in the art.

In one embodiment, the present invention further relates to the immersion lithography system 26, which may include the elements of the immersion lithography system 10 together with the elements of the immersion lithography system 26. The system 26 includes the chamber 42 for receiving a wafer 12 to be exposed and for immersing the wafer in the immersion medium 24. The system 26 further includes the imaging subsystem 20 for directing an exposure pattern 22 towards the wafer 12 and through the traversal volume 38 of the immersion medium 24. The system 26 further includes an immersion medium ultrasonic treatment subsystem 34 including an ultrasonic generator for directing the ultrasonic wave 36 through at least the traversal volume 38 of the immersion medium 24 through which the exposure pattern 22 is configured to traverse. The system 26 further includes the controller 30. The controller 30 is operable to direct an ultrasonic generator 48 to create the ultrasonic wave 36 and to cause it to propagate through the traversal volume 38 for a time and at an energy to disrupt and/or dissipate the at least one bubble 28 in the traversal volume 38. In one embodiment, the ultrasonic generator 48 includes a sonotrode 50 disposed adjacent the immersion medium 24. In one embodiment, the sonotrode 50 is adjacent to, and in one embodiment the sonotrode 50 is integral with, the window 44, as shown in FIG. 2.

Although particular embodiments of the invention have been described in detail, it is understood that the invention is not limited correspondingly in scope, but includes all changes, modifications and equivalents coming within the spirit and terms of the claims appended hereto.

INDUSTRIAL APPLICABILITY

The present invention relates generally to the field of integrated circuit manufacture and, more particularly, to a method and apparatus for elimination of bubbles in immersion medium in immersion lithography systems. The present invention provides a solution to problems including the presence of bubbles in the immersion medium of an immersion lithography system, thus advancing the art towards future generations of increased density with which various structures are arranged on semiconductor wafers. The present invention responds to the need to increase the resolution capability of lithography systems, to enable such increased densities. As a result of the method and apparatus of the present invention, an immersion lithography system may be operated without interference or unwanted dispersion of the exposure pattern by bubbles present in the traversal volume as the exposure pattern is propagated through a traversal volume and towards the wafer.

What is claimed is:

1. A method of operating an immersion lithography system, comprising:
   immersing a wafer to be exposed in a liquid immersion medium;
   directing a laser beam through a portion of the immersion medium;
   determining if a portion of the laser beam beyond a predetermined threshold value becomes scattered, thereby indicating that at least one bubble is present in the immersion medium;
   directing an ultrasonic wave into at least the portion of the immersion medium to disrupt and/or dissipate the at least one bubble; and
   exposing the wafer with an exposure pattern by passing electromagnetic radiation through the immersion medium subsequent to the directing.

2. The method of claim 1, wherein at least one of the at least one bubble is disposed in a traversal volume of the immersion medium.

3. The method of claim 1, wherein the immersion medium comprises a refractive index substantially similar to a refractive index of optical elements in the system.

4. The method of claim 1, wherein the ultrasonic wave has a frequency in the range from about 20,000 Hz to about 500 MHz.

5. The method of claim 1, wherein the ultrasonic wave disrupts localized structure of the immersion medium to disrupt and/or dissipate the at least one bubble.

6. The method of claim 1, wherein the at least one bubble comprises a bubble having a diameter in a range from about 20 nm to about 100 $\mu$m.

7. The method of claim 1, wherein the at least one bubble comprises a bubble having a diameter sufficient to interfere with the electromagnetic radiation used in the exposing.

8. The method of claim 1, wherein the method results in reduced scattering of the electromagnetic radiation.

9. The method of claim 1, wherein the bubbles comprise air bubbles.

10. The method of claim 1, further comprising exposing the wafer with the exposure pattern if the determining indicates that a scattered portion of the laser beam is less than the predetermined threshold value.

11. The method according to claim 1, wherein the determining is carried out by analyzing information relating to detected scattered light.

12. The method according to claim 11, wherein the information relating to detected scattered light comprises intensity of the scattered light, location of the scattered light and combinations thereof.

13. The method according to claim 1, wherein the determining is carried out by analyzing information relating to a detection of the laser beam.

14. The method according to claim 13, wherein the information relating to the laser beam comprises intensity of the laser beam incident on a detecting assembly, location of the laser beam incident on a detecting assembly, and combinations thereof.

15. The method according to claim 1, wherein the entire traversal volume is monitored for the presence of the at least one bubble.

16. The method according to claim 15, wherein multiple laser beams are used to monitor for the presence of the at least one bubble.

17. The method according to claim 15, wherein at least one laser beam is scanned through the traversal volume to monitor for the presence of the at least one bubble.

18. The method according to claim 1, further comprising controlling the immersion lithography system to direct the ultrasonic wave into at least a portion of the immersion medium if at least one bubble is detected.

19. The method according to claim 18, wherein the immersion lithography system is controlled to wait a predetermined period of time and repeat the directing and determining following the directing an ultrasonic wave.

20. A method of operating an immersion lithography system, comprising:
   immersing a wafer to be exposed in a liquid immersion medium;
   directing a laser beam through a volume of the immersion medium through which an exposure pattern is configured to traverse;
   determining if a portion of the laser beam beyond a predetermined threshold value becomes scattered, thereby indicating that at least one bubble is present in the traversal volume;
   directing an ultrasonic wave through at least the traversal volume to disrupt and/or dissipate the at least one bubble; and
   exposing the wafer with an exposure pattern by passing electromagnetic radiation through the traversal volume subsequent to the directing.

21. The method of claim 20, wherein the at least one bubble comprises a bubble having a diameter sufficient to interfere with the electromagnetic radiation used in the exposing.

22. The method of claim 20, wherein the method results in reduced scattering of the electromagnetic radiation.

* * * * *

UNITED STATES PATENT AND TRADEMARK OFFICE
CERTIFICATE OF CORRECTION

| | | |
|---|---|---|
| PATENT NO. | : 7,014,966 B2 | Page 1 of 1 |
| APPLICATION NO. | : 10/653844 | |
| DATED | : March 21, 2006 | |
| INVENTOR(S) | : Pawloski et al. | |

It is certified that error appears in the above-identified patent and that said Letters Patent is hereby corrected as shown below:

Field 56 (References Cited), please insert --International Search Report and Written Opinion of the ISA; Application No. PCT/US2004/028371; mailed July 6, 2005.--.

Field 56 (References Cited), please insert --International Search Report and Written Opinion of the ISA; Application No. PCT/US2004/023875; mailed July 6, 2005.--.

Column 9, Line 39, replace "beam 68 generated" with --beam 66 generated--.

Column 9, Line 52, replace "laser 82 should" with --laser 62 should--.

Column 9, Line 62, replace "windows 66, 70 should" with --windows 68, 70 should--.

Column 11, Line 14, replace "bubble 28. as" with --bubble 28, as--.

Signed and Sealed this

Fifteenth Day of August, 2006

JON W. DUDAS
*Director of the United States Patent and Trademark Office*